US007724168B1

(12) United States Patent
Cruz-Albrecht et al.

(10) Patent No.: US 7,724,168 B1
(45) Date of Patent: May 25, 2010

(54) PULSE DOMAIN LINEAR PROGRAMMING CIRCUIT

(75) Inventors: Jose Cruz-Albrecht, Oak Park, CA (US); Peter Petre, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 11 days.

(21) Appl. No.: 12/262,782

(22) Filed: Oct. 31, 2008

Related U.S. Application Data

(60) Provisional application No. 60/984,354, filed on Oct. 31, 2007.

(51) Int. Cl.
*H03M 1/88* (2006.01)

(52) U.S. Cl. ...................................... 341/138; 341/155

(58) Field of Classification Search ................. 341/138, 341/144, 155, 53; 708/801, 816, 831, 835, 708/839
See application file for complete search history.

(56) References Cited

U.S. PATENT DOCUMENTS

| | | | | |
|---|---|---|---|---|
| 5,185,715 | A * | 2/1993 | Zikan et al. | 708/801 |
| 5,345,398 | A | 9/1994 | Lippmann et al. | 702/53 |
| 5,479,170 | A | 12/1995 | Cauwenberghs et al. | 341/200 |
| 5,566,099 | A * | 10/1996 | Shimada | 708/250 |
| 5,894,280 | A | 4/1999 | Ginetti et al. | 341/118 |
| 6,452,524 | B1 | 9/2002 | Fraleigh et al. | 341/143 |
| 6,473,019 | B1 | 10/2002 | Ruha et al. | 341/143 |
| 6,975,682 | B2 | 12/2005 | Cosand | 375/247 |
| 7,038,608 | B1 | 5/2006 | Gilbert | 341/144 |
| 7,403,144 | B1 | 7/2008 | Cruz-Albrecht et al. | 341/143 |
| 7,405,686 | B2 | 7/2008 | Laroia et al. | 341/143 |

OTHER PUBLICATIONS

Cruz, J.M., et al, "A 16×16 Cellular Neural Network Universal Chip: The First Complete Single-Chip Dynamic Computer Array with Distributed Memory and with Gray Scale Input-Output," Analog Integrated Circuits and Signal Processing, 15, pp. 227-237, 1998.

Dighe, A.M., et al., "An Asynchronous Serial Flash Converter," 9th Int. Conf. on Electronics, Circuits and Systems, IEEE, pp. 13-15, 2002.

(Continued)

*Primary Examiner*—Brian Young
(74) *Attorney, Agent, or Firm*—Ladas & Parry

(57) ABSTRACT

A system for making a pulse domain linear programming circuit. The inputs and the outputs to the pulse domain linear programming circuit are time encoded pulse signals. The circuit includes arrays of two types of cross-coupled time encoding elements. The first type of elements includes two integrators, adders, a hysteresis quantizer, and a 1-bit self-feedback DAC. The second type of elements includes a bias element, a leaky integrator, adders, a fixed memory-less non-linearity, a regular integrator, a hysteresis quantizer and a 1-bit self-feedback DAC. The cross-coupling signals between the two types of elements are pulse time-encoded signals. All of the cross-coupling weights are set via 1-bit DACs having variable gains. The cross-coupling weights are used to set a constraint equation of a pulse domain linear programming problem. Methods to make the foregoing circuit are also described.

22 Claims, 9 Drawing Sheets

OTHER PUBLICATIONS

D. Donoho, "Compressed Sensing," IEEE Transactions on Information Theory, vol. 42, No. 4, pp. 1289-1306, Apr. 2006.
Iwamoto, M., et al., "Bandpass Delta-Sigma Class-S Amplifier," Electronic Letters, vol. 36, No. 12, pp. 1010-1012, Jun. 2000.
J. Keane and L. Atlas, "Impulses and Stochastic Arithmetic for Signal Processing," Proc. 2001 IEEE International Conference on Acoustics, Speech, and Signal Processing, pp. 1257-1260, 2001.
Lazar, A., et al., "Perfect Recovery and Sensitive Analysis of Time Encoded Bandlimited Signals," IEEE Transactions on Circuits and Systems-1 Regular Papers, vol. 51, No. 10, Oct. 2004.
Roza, E., "Analog to Digital Conversion via Duty Cycle Modulation," IEEE Trans. On Circuits and Systems-II, vol. 44, No. 11, pp. 907-914, Nov. 1997.
Walden, R., "Analog to Digital Converter Survey and Analysis," IEEE Journal on Selected Areas in Communication, vol. 17, No. 4, pp. 539-550, Apr. 1999.
U.S. Appl. No. 11/726;484, filed Mar. 22, 2007, Cruz-Albrecht, Jose, et al.
U.S. Appl. No. 60/984,354, filed Oct. 31, 2007, Cruz-Albrecht, Jose.
U.S. Appl. No. 60/984,357, filed Oct. 31, 2007, Prtre, Peter.
Y. Xia and J. Wang, "A Recurrent Neural Network for Solving Nonlinear Convex Programs Subject to Linear Constraints," IEEE Trans. On Neural Networks, vol. 16, No. 2, Mar. 2005.

* cited by examiner

PULSE DOMAIN LINEAR PROGRAMMING CIRCUIT

CROSS REFERENCE TO RELATED APPLICATIONS

This application claims the benefit of U.S. Provisional Patent Application Ser. No. 60/984,354 filed Oct. 31, 2007, the disclosure of which is hereby incorporated herein by this reference.

STATEMENT REGARDING FEDERALLY SPONSORED RESEARCH OR DEVELOPMENT

This invention was funded by a government under contract number N00173-06-C-4151 (DARPA/MTO BAA 05-35 "Analog-to-Information) from DARPA, Washington, D.C.

INCORPORATION BY REFERENCE

References cited within this application, including patents, published patent applications other publications, such as listed below:

1. A. Lazar and L Toth, "Perfect Recovery and Sensitivity Analysis of Time Encoded Bandlimited Signals," IEEE Trans. on Circuits and Systems-I, vol. 51, no. 10, pp. 2060-2073, October 2004.
2. Y. Xia and J. Wang, "A Recurrent Neural Network for Solving Nonlinear Convex Programs Subject to Linear Constraints", IEEE Trans. on Neural Networks, vol. 16, no. 2, March 2005.
3. D. Donoho, "Compressed Sensing," IEEE Transactions on Information Theory, vol. 42, no. 4, pp. 1289-1306, April 2006, are each hereby incorporated by reference in their entirety along with the Provisional Application identified above.

BACKGROUND

1. Technical Field

This disclosure is generally related to circuits for linear programming and in particular to pulse domain linear programming circuits.

2. Description of Related Art

Typically, a circuit performing time encoding does not process or solve a linear programming problem. Linear programming is a well known mathematical technique for finding an optimized answer to many practical problems in operations research and in many technological arts as well, such as recovery of signals captured by compressed sensing.

Prior art circuits solve linear programming problems using conventional analog signals. Consequently, such prior art circuit utilize analog amplifiers. The accuracy of such prior art circuits is limited by the linearity of the analog amplifier, commonly used in an internal input.

FIG. 1 shows a prior art analog-input time encoder. See also reference 1 identified above. This circuit has a single analog input u(t) and a single pulse output z(t). This circuit encodes analog input signals u(t) into pulse signals z(t). If the analog signal is bandlimited, the encoding can be practically without loss of information. That is, the input u(t) can be recovered from the timing of the output signal z(t). A time decoding machine can be used to recover the analog input u(t) from the asynchronous pulse output z(t). Assuming ideal elements, practically no quantization error is introduced by this encoder. The circuit of FIG. 1 has an input analog linear amplifier (g1), an integrator, a hysteresis quantizer, a feedback element (g3), and an adder (+). This circuit is not used for linear programming or other optimization problems.

FIG. 2 shows a prior art circuit to solve a linear programming problem in an analog domain. See prior art reference 2 identified above. This circuit has n analog inputs and N analog outputs. The circuit of FIG. 2 can solve problems of the type $$\min(f(Z))\ s.t.\begin{cases} A\times Z=Y \\ Z_i\geq 0\ \ i=1,\ \ \ldots\ \ ,N \end{cases} \quad \text{(Equation 1)}$$

where A is a constraint matrix with n rows and N columns, Y is an input column vector of n analog numbers, Z is an output column vector of N analog numbers, and f is a linear function of the output vector. All of the signals in the circuit of FIG. 2 are conventional analog signals. The circuit of FIG. 2 is shown in a vector symbolic form. The matrix multiplication symbols represent arrays of variable-gain analog amplifiers, such as analog multipliers, and adders. The accuracy of this circuit is limited by the linearity of these variable-gain analog amplifiers.

BRIEF DESCRIPTION OF THE INVENTION

Embodiments of the present disclosure provide a system and method for making a pulse domain linear programming circuit. The inputs and the outputs to the pulse domain linear programming circuit are time encoded pulse signals.

The circuit includes arrays of two types of cross-coupled time encoding elements. The first type of elements includes two integrators, adders, a hysteresis quantizer, and a 1-bit self-feedback DAC.

The second type of elements includes a bias element, a leaky integrator, adders, a fixed memory-less non-linearity, a regular integrator, a hysteresis quantizer and a 1-bit self-feedback DAC. The cross-coupling signals between the two types of elements are pulse time-encoded signals. All of the cross-coupling weights are set via 1-bit DACs having variable gains. The cross-coupling weights are used to set a constraint equation of a pulse domain linear programming problem.

The present disclosure also includes a method of making a circuit for linear programming in the pulse domain. The method includes providing a linear time encoder having an input, the input including a first adder, and an output, providing at least a first cross-connection element and a second cross-connection element, each having an input and an output, and connecting the output of the linear time encoder to the input of the first cross-connection element. The method may further include providing a non-linear time encoder having an input, the input including a first adder, and an output, connecting the output of the first cross-connection element to a first input of the first adder of the non-linear time encoder, connecting the output of the non-linear time encoder to the input of the second cross-connection element, and connecting the output of the second cross-connection element to an input of the first adder of the linear time encoder.

Other systems, methods, features, and advantages of the present disclosure will be, or will become apparent, to a person having ordinary skill in the art upon examination of the following drawings and detailed description. It is intended that all such additional systems, methods, features, and advantages included within this description, be within the scope of the present disclosure, and be protected by the accompanying claims.

BRIEF DESCRIPTION OF THE DRAWINGS

Many aspects of the disclosure can be better understood with reference to the following drawings. Components in the drawings are not necessarily to scale, emphasis instead being placed upon clearly illustrating the principles of the present disclosure. Moreover, in the drawing, like-referenced numerals designate corresponding parts throughout the several views.

FIG. 3 shows a block diagram of a pulse domain linear programming circuit of the present disclosure in vector form and FIG. 3*a* depicts the non-linear time encoder thereof in somewhat greater detail while

DETAILED DESCRIPTION

The present disclosure relates a system and method for making a pulse domain linear programming circuit. Specifically, the pulse domain linear programming circuit can be used for a real-time recovery of signals captured via compressed sensing, in which a linear programming optimization problem is solved in a pulse domain.

Figure 2:
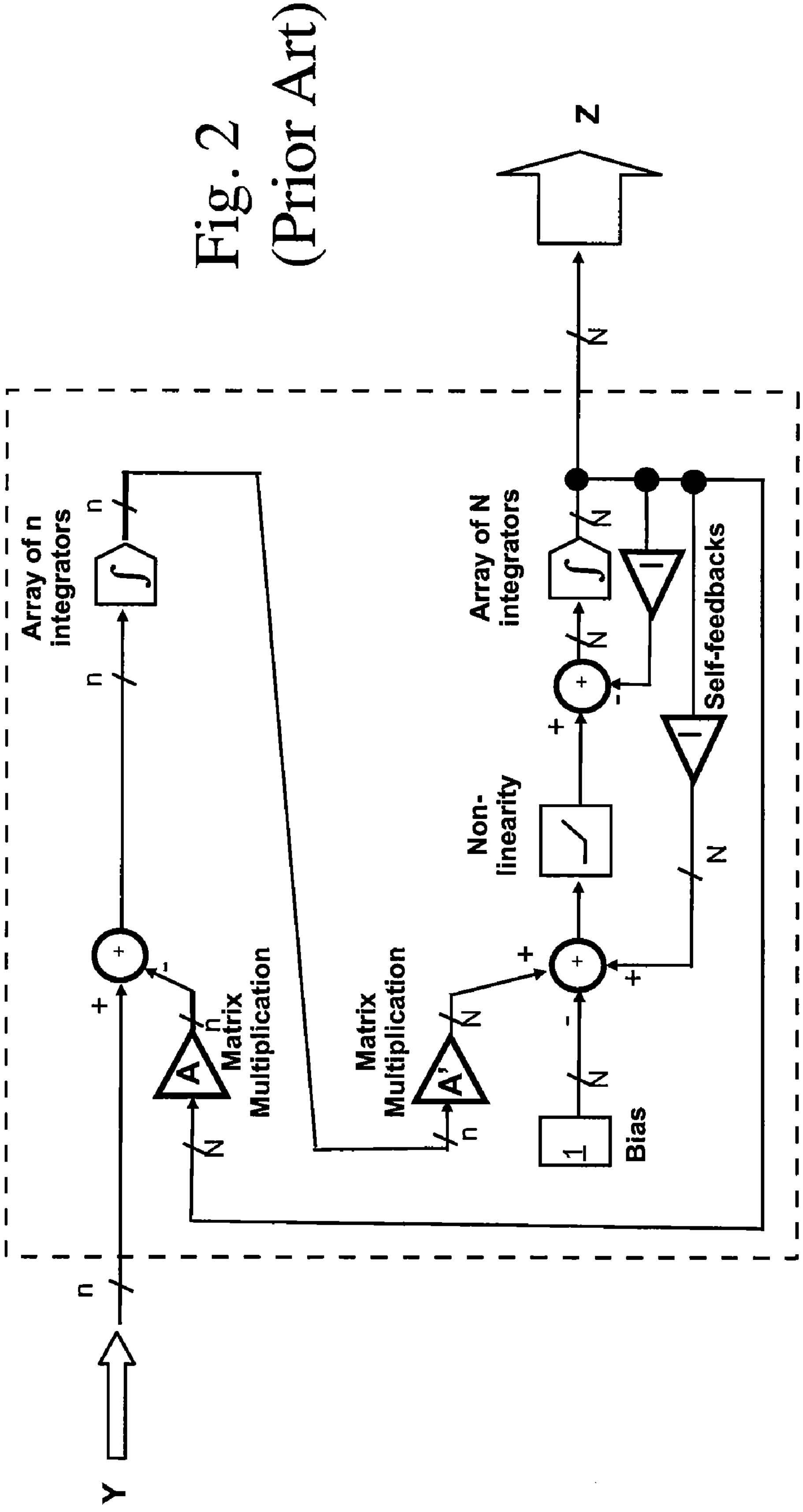
Fig. 2 (Prior Art)
FIG. 2 illustrates a prior art circuit to solve a linear programming problem in an analog domain.
Figure 3:
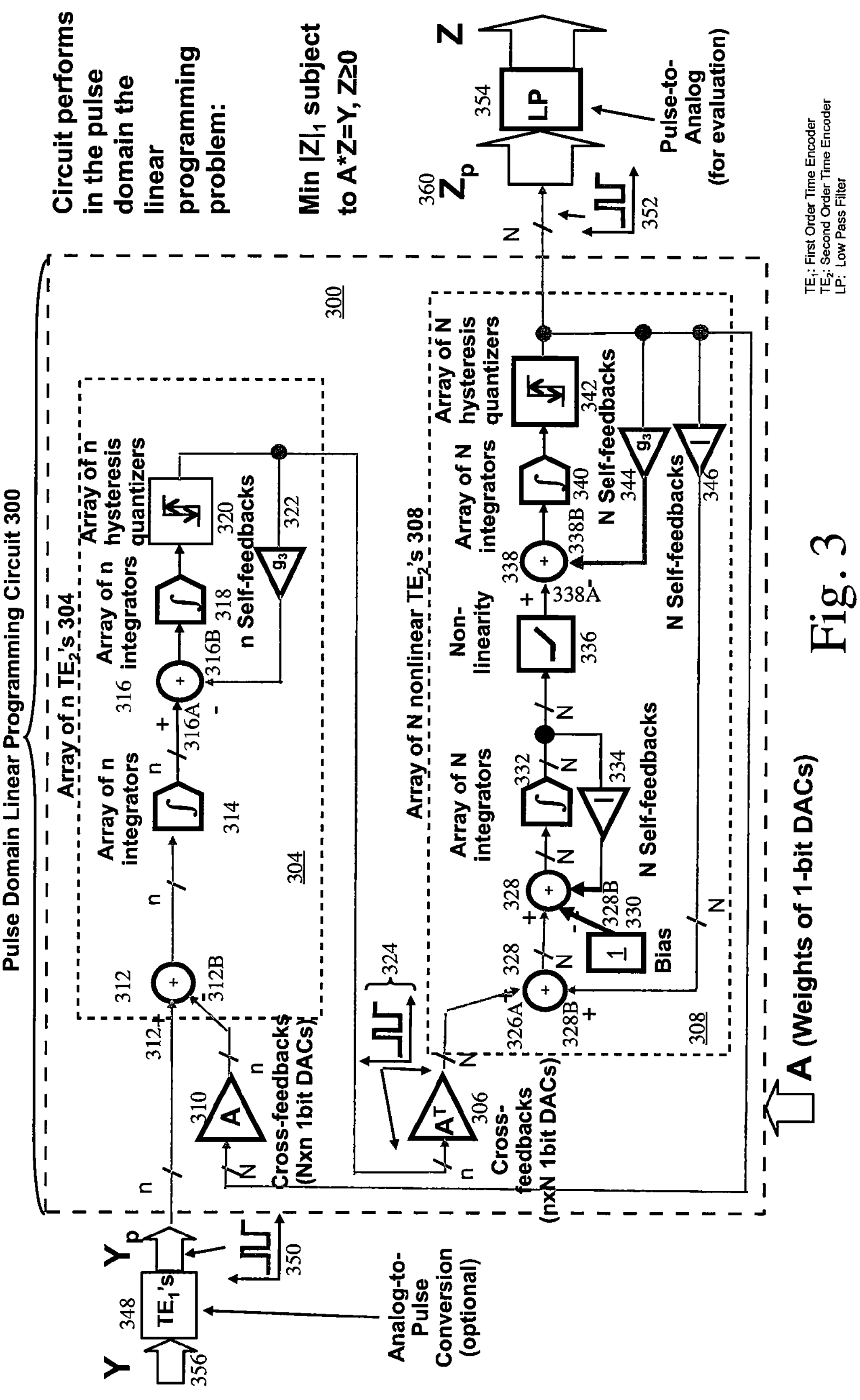

FIG. 3 shows a block diagram of a pulse domain linear programming circuit 300 of the present disclosure, suitable for solving the linear programming problem of Equation 1 in the pulse domain. The pulse domain linear programming circuit 300 does not need analog variable-gain amplifiers used in the prior art (FIG. 2). The pulse domain linear programming circuit 300, for example, solves in the pulse domain the following linear programming problem:

$$\mathrm{Min}|Z|_1 \text{ subject to } A*Z=Y,Z0.$$

That is, minimize $|Z|_1$ subject to the above constraint. $|Z|_1$ is the norm-1 of the vector Z. $|Z|_1$ is defined as:

$$|Z|_1=Zi, \text{ the summation range being } i=1 \text{ to } N.$$

As a person having an ordinary skill in the art will appreciate, an arrow entering a block or a symbol indicates an input and an arrow leaving a block or a symbol indicates an output. Similarly, connections described below may be of any electromagnetic type, such as electrical, optical, radio-frequency, and magnetic.

The circuit of FIG. 3 is shown in vector form. The input for the circuit 300 is a vector of signal of size n. The output is a vector of signals of size N. The number of outputs, N, is larger than the number of inputs, n. Each signal line or arrow represents a signal bus. Each bus has size n or N as shown in FIG. 3. Each bus is implemented by a group of n or N wires. Each block symbol, such as integrators, quantizers, 1-bit DACs, shown in FIG. 3 represents a parallel array of actual circuit elements, such as array of integrators, array of quantizers, array of 1-bit DACs, and so on. The pulse domain linear programming circuit 300 includes n number of the linear time encoders, n×N number of the first cross-connection elements 306, N×n number of the second cross-connection elements 310, and N number of the non-linear time encoders 308.

Figure 1:
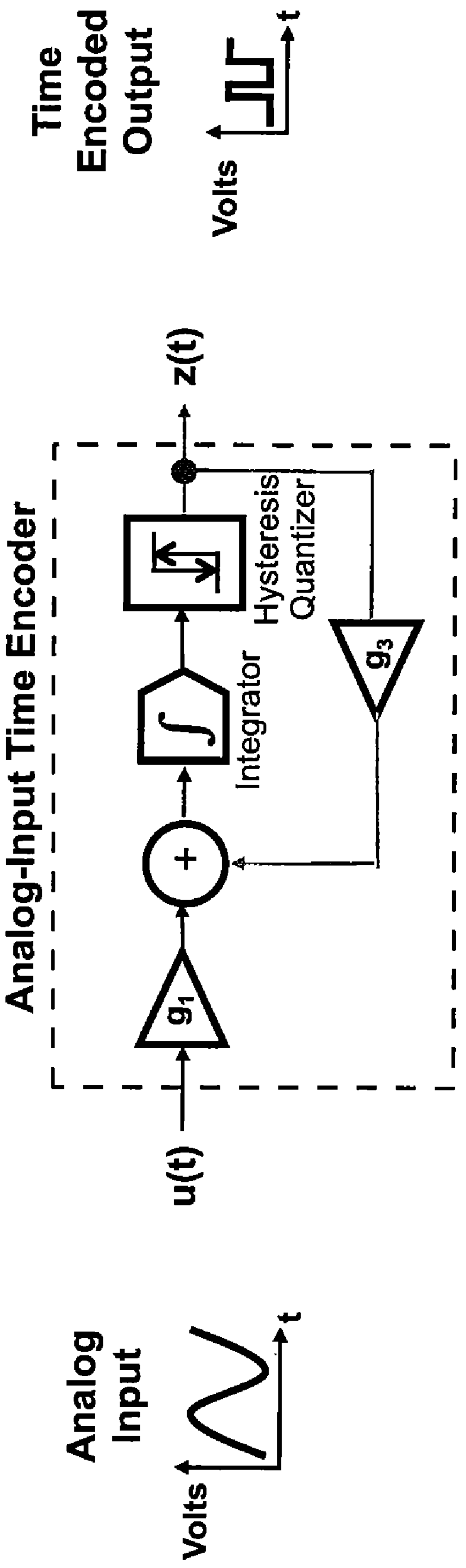
Fig. 1 (Prior Art)
FIG. 1 illustrates a prior art analog-input time encoder.

The first component of circuit of FIG. 3 is a time encoder block 348. This block 348 is also labeled as $TE_1$ and is located at the left side of FIG. 3. This block 348 is an array of n individual time encoders. Block 348 is optional and therefore does not need to be a part of the pulse domain programming circuit 300. This block 348 is used, if needed, to convert analog input data Y into the time encoded pulse domain $Y_p$. This block 348 is not required in those applications in which the input data is already in the time encoded pulse domain. If the input data 356 is in the analog domain then each of the n individual time encoders 348 of the array of time encoders may be implemented by a prior art time encoder such as the prior art time encoder depicted by FIG. 1. This array of time encoders 348 converts the analog input vector, Y, into a pulse time encoded vector, $Y_p$. Both Y and $Y_p$ are vectors of size n.

The vector $Y_p$ is fed into the input bus, of size n, of the pulse domain programming circuit 300. This bus is connected into an first adder 312 of a linear time encoder 304. The adder 312 is actually composed of an array of n individual adders. Each individual adder 312 of the array of adders in an array, of size n, of linear time encoders 304 combines one individual element of $Y_p$ with one individual feedback signal.

Each linear time encoder 304 of the array of linear time encoders preferably includes a first integrator 314, a second adder 316, a second integrator 318, a hysteresis quantizer 320 and a 1-bit DAC (g3) 322. Each of these elements are preferably implemented as an array of elements of size n in order to form the array of linear time encoders 304.

Considering an individual instance of a linear time encoder 304, an output of the first adder 312 is connected to an input of the first integrator 314, an output of the first integrator 314 is connected to a first input 316A of the second adder 316. An output of the second adder 316 is connected to an input of the second integrator 318, an output of the second integrator 318 is connected to an input of the hysteresis quantizer 320, and an output of the hysteresis quantizer 320 is provides the output of the linear time encoder 304. It should be noted that the hysteresis quantizer 320 is merely an exemplary quantizer and other types of quantizers may also be utilized.

Considering the linear time encoder 304 as an array of size n, the outputs of the array of adders 312 are each connected to an integrator 314 in an array of n individual integrators 314. The outputs of the array of integrators 314 are each connected to a second adder 316 in an array of n individual adders 316. Other blocks at the top half of FIG. 3 are the second integrator 318 (implemented as array of n individual integrators 318), a hysteresis quantizer 320 (formed by array of n individual hysteresis quantizers 320) and a self-feedback elements g3 (preferably consisting of an array of n 1-bit DACs 322).

The pulse domain linear programming circuit 300 includes an array of size n of linear time encoders 304 having an input and an output. A array of first cross-connection elements 306 and an array of second cross-connection elements 310, each having inputs and outputs, couple the array of size n of linear time encoders 304 to an array of size N of the of non-linear time encoders 308 shown in the lower portion of FIG. 3 and also shown by FIG. 3*a*.

Considering an individual instance of the non-linear time encoder 308, it has an input coupled to a first adder 326 and an output, the output of an instance of the first cross-connection element 306 being connected to a first input 326A of the first adder 326 of the non-linear time encoder 308 and the output of the non-linear time encoder 308 being connected to the input of the second cross-connection element 310. The output of an instance the second cross-connection element 310 is connected to a second input 312B of the first adder 312 of the linear time encoder 304. Each instance of non-linear time encoder 308 includes the first adder 326 having a second input 326B and an output, a second adder 328 having a first input 328A, a second input 328B, a third input 328C, and an output, a first integrator 332 having an input and an output, a non-linear element 336 having an input and an output, a third adder 338 having a first input 338A, a second input 338B, and an output, a second integrator 340 having an input and an output, a hysteresis quantizer 342 having an input and an output, a first self-feedback element 334 having an input and an output, a second self-feedback element 346 having an input and an output, a third self-feedback element 344 having an input and an output, and a bias element 330 having an output. The output of the first adder 326 is connected to a first input 328A of the second adder 328, the output of the second adder 328 is connected to the input of the first integrator 332, the output of the first integrator 332 is connected to the input of the non-linear element 336, the output of the non-linear element 336 is connected to the first input 338A of the third adder 338, the output of the third adder 338 is connected to the input of the second integrator 340, the output of the second integrator 340 is connected to the input of one of the hysteresis quantizer 342, the output of hysteresis quantizer 342 is connected to the output of the non-linear time encoder 308 giving waveform 352 as $Z_p$ or 360, the output of the bias element 330 is connected to the second input of 328B the second adder 328, the output of the first integrator 332 is connected to the input of the first self-feedback element 334, the output of the first self-feedback element 334 is connected to the third input 328C of the second adder 328, the output of the hysteresis quantizer 342 is connected to the inputs of the second and third self-feedback elements 346 and 344, the output of the second self-feedback element 346 is connected to the second input 326B of the first adder 326 and the output of the third self-feedback element 344 is connected to the second input 338B of the third adder 338. Self-feedback elements 334, 344 and 346 are each preferably implemented by 1-bit DACs. The transfer function of non-linear element 336 is shown in FIG. 3. Regarding the transfer function of non-linear element 336, when its input is less or equal to zero the nonlinear circuit 336 should provide an output equal to zero. For inputs larger than zero the output should increase (but not necessarily linearly) as the input is increased. The transfer function shown in FIG. 3 for non-linear element 336 has both a break point and a slope. To get a proper solution of the equations, the breakpoint should be set to 0 and the slope to a positive value. A typical value of the slope is 1.

In FIG. 3 each triangular drawing with a label g3 represents an array of 1-bit DAC's, with each individual DAC having gain equal to g3, while each triangular drawing with a label I (Identity) represents an array of 1-bit DAC's, with each individual DAC having gain equal to one.

Considering the non-linear time encoder 308 as an array of size N, the outputs of the array of adders 326 are each connected an input 328A in an array of adders 328 whose outputs are connected to to an integrator 314 in an array of N individual integrators 314. The non-linear time encoder 308 has several adders blocks 326, 328, 338 (each one is an array of N individual adders), two integrators 332 and 340 (each formed by an array of N integrators), a nonlinear element 336 (formed by an array of N nonlinear elements) a hysteresis quantizer 342 (formed by an array of N individual hysteresis quantizers) and three self-feedback elements 334, 344 and 346 (each one consisting of an array of N 1-bit DACs.) The first integrator 332 and the self-feedback element 334 from its output to its input, is equivalent to just one leaky integrator block 333 (formed by an array of N individual leaky integrators), which can be directly and efficiently implemented in VLSI. The bias element 330 is used to provide a set of N constant values that determine the function f to be minimized. The circuit of FIG. 3 can accept values from the bias block either in analog format or in pulse time encoded format.

The function f is a linear function as shown below $$f(Z) = \sum_{i=1}^{N} b_i \times Z_i \quad \text{(Equation 2)}$$

where the $b_i$ coefficients are the N outputs of the bias element 330.

The N non-linear time encoders 308 implement, in the pulse domain, the dynamics of N coupled non-linear first order differential equations. The n linear time encoders 304 implement, in the pulse domain, the dynamics of n coupled linear first order differential equations.

Figure 3A:
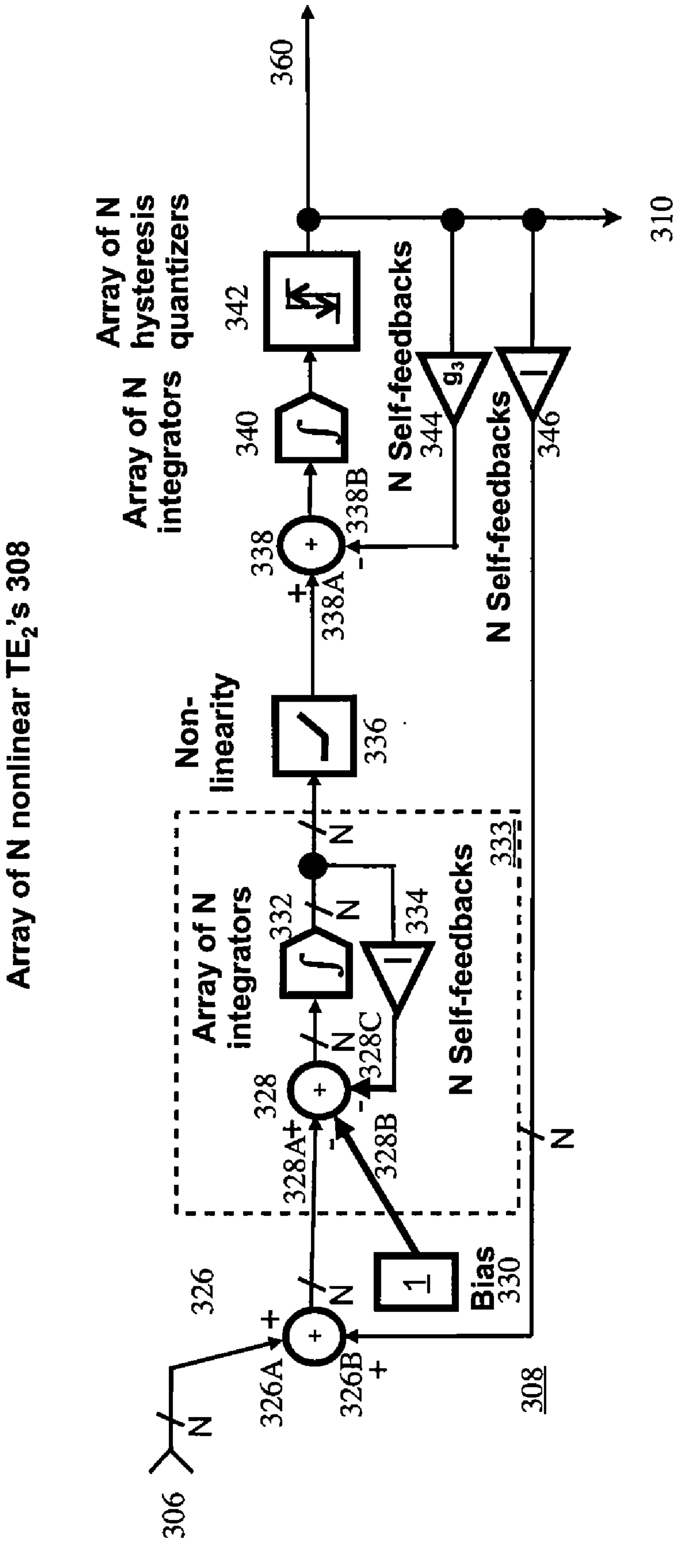

In FIGS. 3 and 3*a*, the output $Z_p$ 360 of the pulse domain linear programming circuit 300 is optionally connected to an input of an array of lowpass filters 354, with the array of the lowpass filters 354 outputting an analog output 362.

Circuit 300 includes an array of size n of linear time encoders 304, an array of first cross-connection elements 306, an array of second cross-connection elements 310, an array of size N of non-linear time encoders 308, and optionally an array of size n of time encoders 348, and an array of lowpass filter 354 having an input of size n.

It should be noted here that the waveforms 324, 350, and 352 represent time encoded pulses at respective locations depicted in FIG. 3.

Figure 3B:
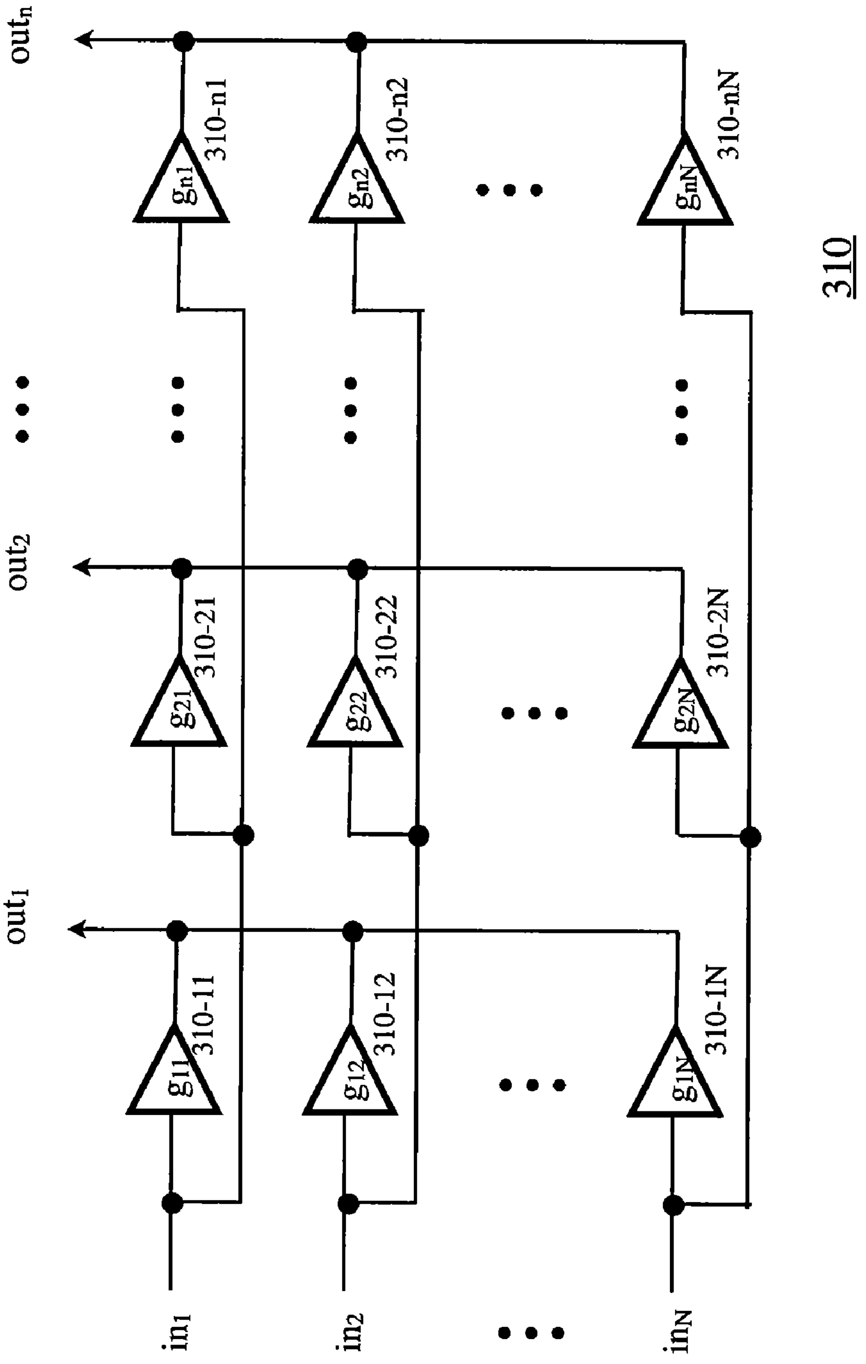
FIG. 3*b* depicts the two dimensional arrays of 1-bit DACs in detail.

The pulse domain linear programming circuit 300 contains first and second cross-connection elements 306 and 310, labeled A and $A^T$ (transpose of matrix A). The first and second cross-connection elements 306 and 310 contain an array of N×n individual 1-bit DACs. Each 1-bit DAC may be very compact, including. for example, a simple switch that can be implemented with as few as two transistors in VLSI and can operate at high speed, and is intrinsically linear due to a two-state operation. The gains of the N×n individual 1-bit DACs 310-11 through 310-nN (see FIG. 3*b*) are the values of the N×n entries of the matrix A of Equation 1. As such, A is shown as in input to pulse domain linear programming circuit 300 at the bottom of FIG. 3.

In FIG. 3 each triangular symbol with label A or $A^T$ represents a two dimensional array of 1-bit DACs. The array contains n×N individual DACs. Each individual 1-bit DAC of each array has a single voltage input and a single current output. The inputs, outputs, and the internal structure of the complete arrays (see FIG. 3*b*) are as follows:

(a) For the case of the triangular symbol 310 with label A there are N inputs and n outputs. The array of individual 1-bit DACs are typically arranged as a two dimensional structure with N rows and n columns, with one individual one-bit DAC 310-11-310-nN in each location. Each one of the N input wires (encoding N voltage signals) $in_1$-$in_N$ fed the inputs of all the individual DACs located in each one of the N rows of the two dimensional array. Each one of the n output wires (encoding n current signals) $out_1$-$out_n$ is connected to the outputs of all the individual DACs located in each one of the n columns of the two dimensional array. Note that the currents of all individual DACs in each column are summed together by just connecting their outputs together. Each individual one-bit DAC has a gain identified by the letters $g_{11}$-$g_{nN}$. Those gains are set according to the values of matrix A of Equation 1 as explained above.

(b) For the case of the triangular symbol 306 with label $A^T$ there are n inputs and N outputs. The array of individual 1-bit DACs are typically arranged as a two dimensional structure with n rows and N columns, with one individual DAC in each location. Each one of the n input wires (encoding n voltage signals) fed the inputs of all the individual DACs located in each one of the n rows of the two dimensional array. Each one of the N output wires (encoding N current signals) is connected to the outputs of all the individual DACs located in each one of the N columns of the two dimensional array. Note that the currents of all individual DACs in each column are summed together by just connecting their outputs together. By interchanging the capital N's and the lowercase n's and the number 306 for the number 310 in FIG. 3*b*, the circuitry for the array $A^T$ 306 will be apparent.

Figure 4:
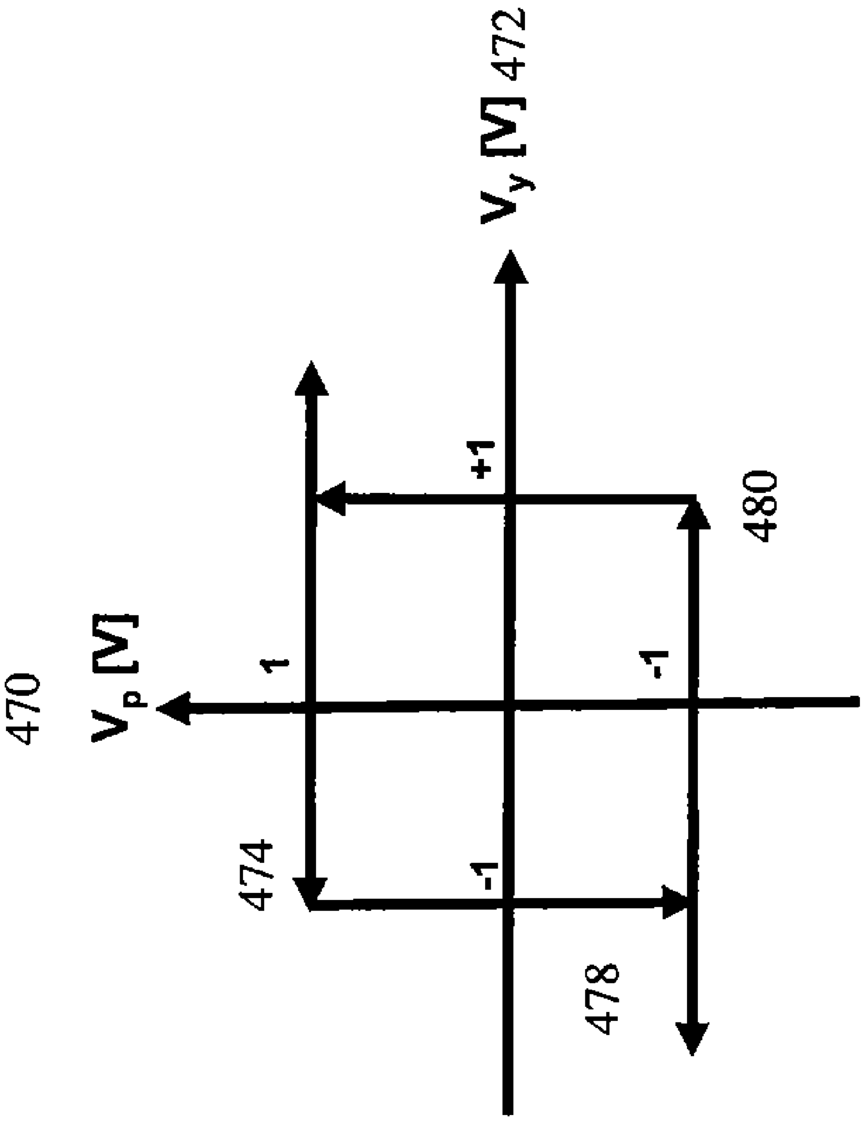
FIG. 4 illustrates an input-output characteristic of an exemplary hysteresis quantizer.

FIG. 4 illustrates an input-output characteristic of an exemplary hysteresis quantizer 320, 342. There are two possible output levels, −1 and +1, defined by arrows having reference numerals 474, 476, 478, and 480. The vertical axis 470, indicating Vp[V], and horizontal axis 472, indicating Vy[V], make the graph. The transition between the two output levels occurs at two different input trigger voltage levels. In an example described below, these trigger voltage levels are normalized to −1V and +1V. They are shown in the horizontal axis 472 of the graph. These values can be scaled, as suited for a particular VLSI implementation, without changing the basic operation of the circuit.

The pulse domain linear programming circuit 300 output is represented by the vector $Z_p$ 360. This vector 360 is of size N. The size of the vector 360 is larger than that of the input vector $Y_p$ 358. The output depends on the input data, the weights of the 1-bit DACs (of the first and second cross connect elements 306 and 310) being the entries of the matrix A of Equation 1, and the data of bias element 330 defining the function f of Equation 1.

The vector $Z_p$ 360 contains the time encoded data. The output becomes valid after the pulse domain linear programming circuit 300 has settled to a steady state. The output 360 can be optionally converted to analog data Z 362 for evaluation. The conversion to analog data 362 can be done by using a low pass filter 354, also labeled "LP," which may be formed by an array of N individual low pass filters 354. The analog output 362 is the vector Z, of size N.

In an illustrative simulation, operation of the pulse domain linear programming circuit 300 having random inputs and random constraints (entries of matrix A) has been simulated. The pulse domain linear programming circuit 300 converges to a solution expected from traditional algorithms. Below is shown an exemplary operation of the pulse domain linear programming circuit 300 for this simulation and a summary of the parameters and data used:

The size of the input vector was n=4

The size of the output vector was N=6. Thus the matrix A was of size n×N=4×6=24 elements.

The input vector for this simulation was:

$$Y = \begin{vmatrix} 0.3729 \\ 0.5170 \\ 0.1382 \\ 0.0802 \end{vmatrix}$$

The matrix A was:

$$A = \begin{vmatrix} 0.4398 & 0.3932 & 0.4586 & 0.1603 & 0.9669 & 0.1370 \\ 0.3400 & 0.5915 & 0.8699 & 0.8729 & 0.6649 & 0.8188 \\ 0.3142 & 0.1197 & 0.9342 & 0.2379 & 0.8704 & 0.4302 \\ 0.3651 & 0.0381 & 0.2644 & 0.6458 & 0.0099 & 0.8903 \end{vmatrix}$$

The bias coefficients were set to 1. This sets the linear function to be minimized as the addition of all of the six entries of the output vector, as indicated below:

$$f(Z) = \sum_{i=1}^{N} b_i \times Z_i$$

Figure 5:
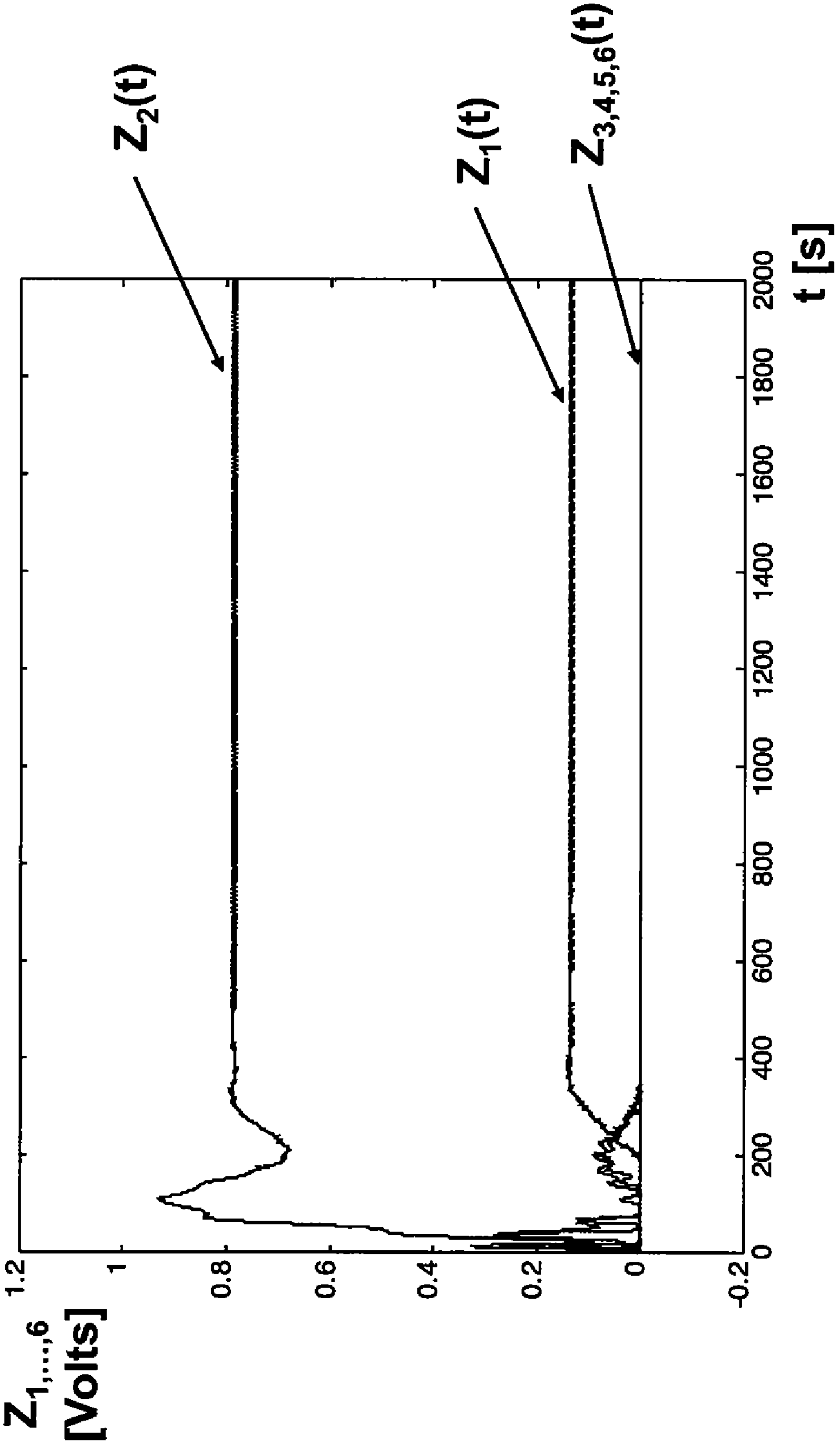
FIG. 5 shows outputs of the pulse domain linear programming circuit of the present disclosure during a transient simulation.

FIG. 5 shows outputs of the pulse domain linear programming circuit 300 during a transient of this illustrative simulation, featuring a plot with the six outputs ($Z_1, Z_2, \ldots, Z_6$) settling over time. It can be observed that the outputs reach a steady constant state. The steady final values correspond to a solution of the linear programming problem of this illustrative simulation.

Figure 6A:
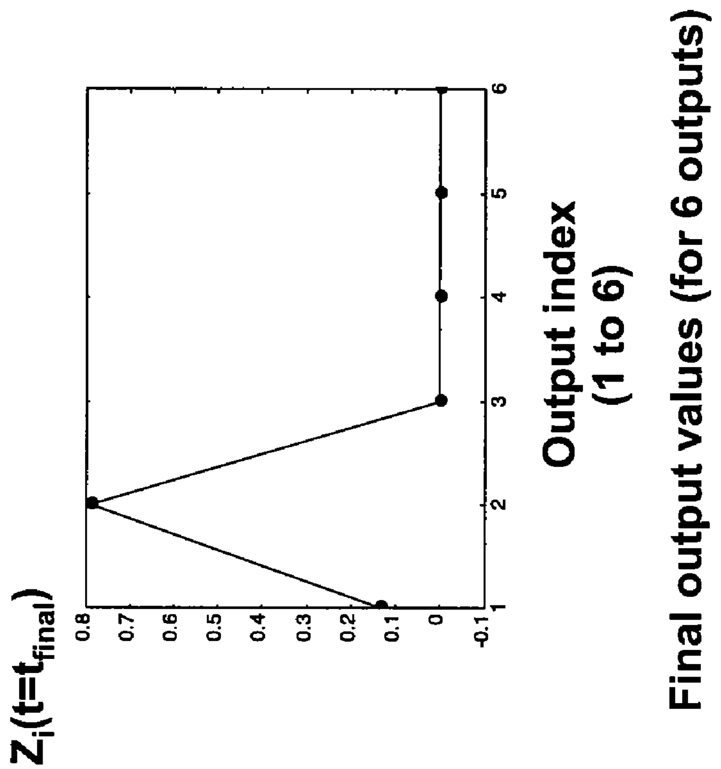
FIGS. 6(*a*) and 6(*b*) illustrates a comparison of outputs of the pulse domain linear programming circuit of the present disclosure (see FIG. 6(*a*)) to ideal outputs (see FIG. 6(*b*)).
Figure 6B:
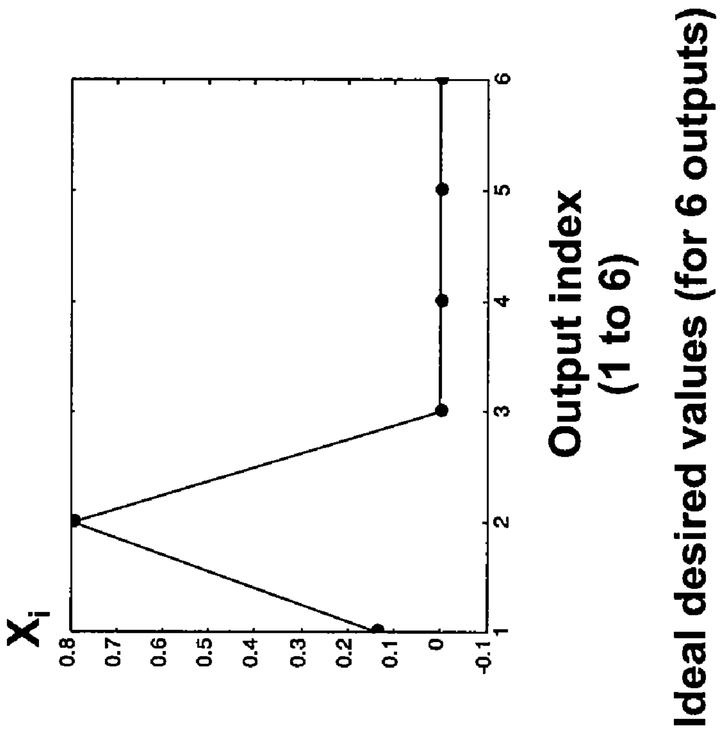

FIGS. 6(*a*) and 6(*b*) illustrate a comparison of outputs of the linear programming circuit of the present disclosure (see FIG. 6(*a*)) to ideal outputs (see FIG. 6(*b*)). The six outputs of the pulse domain linear programming circuit 300 (steady values from FIG. 5) with desired ideal values calculated by solving the linear programming problem of the example by a standard, non real-time, digital algorithm, in a MATLAB® simulation. In FIG. 6(*a*), $Z_i$ represent the output values produced by the pulse domain linear programming circuit 300, while in FIG. 6(*b*) $X_i$ represent desired ideal values. It can be observed the pulse domain linear programming circuit 300 solution is correct for all six values.

An advantage of the pulse domain linear programming circuit 300 is an ability to solve the linear programming problem by a circuit that operates in parallel and can provide the solution in real time as digital algorithms typically cannot operate in real time. The pulse domain linear programming circuit 300 does not require linearity-limiting feedback analog amplifiers whereas standard analog circuits require such amplifiers.

The pulse domain linear programming circuit 300 can be efficiently implemented in VLSI technology. The pulse domain linear programming circuit 300 can be compact with only three transistors required for each individual 1-bit DAC using DAC designs known in the prior art. In a state-of-the-art InP technology, the pulse domain linear programming circuit 300 can operate with a pulse rate of approximately 23 GHz, and can solve a typical linear programming problem in less than 10 ns. The gains $g_3$ of one bit DACs 322 and 344 are typically the same value and are adjusted as needed to set the pulse rate of the circuit 300. For a pulse rate of 23 GHz, the gain $g_3$ should be about 4.6 mA/volt assuming a typical integrator (for integrators 318 and 340) implemented with a capacitor of 100 fF and using InP technology for the devices. In such an embodiment, integrators 314 and 332 can be implemented using capacitors having a values of equal to two to three orders of magnitude greater than than of capacitors 318 or 340 so that the time constant of the circuit is typically to two and three orders of magnitude longer than the pulse time period.

The pulse domain linear programming circuit 300 can solve linear programming substantially in real time because: it operates in parallel, the internal components arc compact (allows large amount of parallelization), and the internal components can operate at high speed. The pulse domain linear programming circuit 300 has a parallel architecture. Two asynchronous 1-bit DACs are required in cross connection elements 306 and 310 for each element of the matrix A. Each 1-bit DAC is a very compact circuit that requires only three transistors. This allows the implementation of large circuit arrays in a single integrated circuit chip.

Each asynchronous 1-bit DAC can operate at very high speed (~10 GHz range in a standard 90 nm CMOS technology and ~60 GHz in an InP HBT technology). The other components of the architecture (hysteresis quantizers and analog integrators) can also operate at similar speeds.

Figure 7:
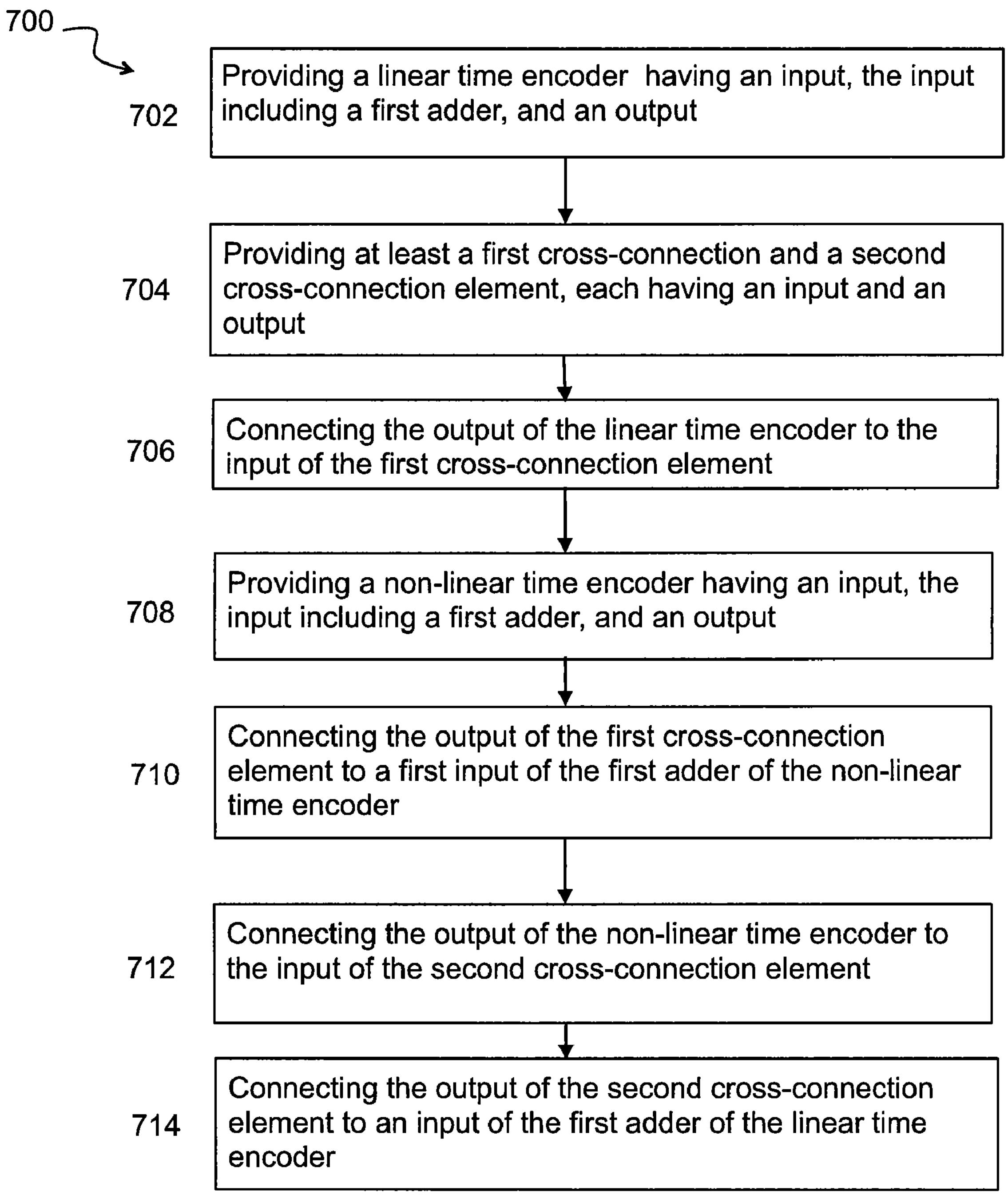
FIG. 7 illustrates a flowchart of a method of the present disclosure.

FIG. 7 is a flowchart of a method 700 of making the pulse domain linear programming circuit 300. The method 700 includes providing a linear time encoder having an input, the input including a first adder, and an output (block 702), providing at least a first cross-connection element and a second cross-connection element, each having an input and an output (block 704), connecting the output of the linear time encoder to the input of the first cross-connection element (block 706), providing a non-linear time encoder having an input, the input including a first adder, and an output (block 708).

The method 700 may further include connecting the output of the first cross-connection element to a first input of the first adder of the non-linear time encoder (block 710), connecting the output of the non-linear time encoder to the input of the second cross-connection element (block 712), connecting the output of the second cross-connection element to an input of the first adder of the linear time encoder (block 714).

In the method 700, the providing the linear time encoder may further include:

providing a first integrator, providing a second adder, providing a second integrator, providing one of a quantizer having an output and a hysteresis quantizer having an output, connecting an output of the first adder to an input of the first integrator, an output of the first integrator to a first input of the second adder, connecting an output of the second adder is connected to an input of the second integrator, connecting an output of the second integrator to an input of one of the quantizer and the hysteresis quantizer, and connecting an output of one of the quantizer and the hysteresis quantizer to the output of the linear time encoder.

Still further, in the method 700, the connecting the output of the hysteresis quantizer further includes connecting an amplifier between one of an output of the quantizer and an output of the hysteresis quantizer and a second input of the second adder. It may be emphasized here that connecting the hysteresis quantizer is just an illustrative option since the method may also include connecting another type of quantizer.

In order to make an array including various elements described above, the method 700 may further include providing a plurality of the linear time encoders, providing a plurality of the first cross-connection elements, providing a plurality of the second cross-connection elements, and providing a plurality of the non-linear time encoders.

In the method 700, the providing the linear time encoder further includes connecting the input of the linear time encoder to a pulse time encoded signal. The connecting the input of the linear time encoder further includes generating the pulse time encoded signal from an analog signal processed by a time encoder. The providing the non-linear time encoder further includes connecting the output of the non-linear time encoder to an input of a lowpass filter, an output of the lowpass filter outputting an analog output.

Regarding the providing the non-linear time encoder, the method 700 may include providing the first adder to have a second input and an output, providing a second adder to have a first input, a second input, a third input, and an output, providing a first integrator to have an input and an output, providing a non-linear element to have an input and an output, providing a third adder to have a first input, a second input, and an output, providing a second integrator to have an input and an output, providing one of a quantizer and a hysteresis quantizer, each to have an input and an output, providing a first self-feedback element to have an input and an output, providing a second self-feedback element to have an input and an output, and providing a bias element to have an output, and connecting the output of the first adder to a first input of the second adder, the output of the second adder being connected to the input of the first integrator, connecting the output of the first integrator to the input of the non-linear element, connecting the output of the non-linear element to the first input of the third adder, connecting the output of the third adder to the input of the second integrator, connecting the output of the second integrator to the input of one of the quantizer and the hysteresis quantizer, connecting the output of the one of the quantizer and the hysteresis quantizer to the output of the non-linear time encoder, connecting the output of the bias element to the second input of the second adder, connecting the output of the first integrator to the input of the first self-feedback element, connecting the output of the first self-feedback element to the third input of the second adder, connecting the output of the one of the quantizer and the hysteresis quantizer to the input of the second self-feedback element, and connecting the output of the second self-feedback element to the second input of the first adder.

In the method 700, the connecting the output of the one of the quantizer and the hysteresis quantizer further includes providing an amplifier having an input and an output, connecting the input of the amplifier to the output of the one of the quantizer and the hysteresis quantizer and connecting the output of the amplifier to the second input of the third adder.

Still further, in the method 700, the providing the first cross-connection element further includes providing a plurality of digital-to-analog converters having at least one bit. The providing the second cross-connection element further includes providing a plurality of digital-to-analog converters having at least one bit.

The foregoing method 700 or elements of the method 700 may also be stored on a computer-readable medium having computer-executable instructions to implement the method 700 or the elements of the method 700.

As a person having ordinary skill in the art would appreciate, the elements or blocks of the methods described above could take place at the same time or in an order different from the described order.

It should be emphasized that the above-described embodiments are merely some possible examples of implementation, set forth for a clear understanding of the principles of the disclosure. Many variations and modifications may be made to the above-described embodiments of the invention without departing substantially from the principles of the invention.

All such modifications and variations are intended to be included herein within the scope of this disclosure and the present invention and protected by the following claims.

What is claimed is:

1. A circuit for linear programming in a pulse domain, the circuit comprising:

a linear time encoder having an input, the input including a first adder, and an output;

at least a first cross-connection element and a second cross-connection element, each having an input and an output;

the output of the linear time encoder being connected to the input of the first cross-connection element;

a non-linear time encoder having an input, the input including a first adder, and an output, the output of the first cross-connection element being connected to a first input of the first adder of the non-linear time encoder and the output of the non-linear time encoder being connected to the input of the second cross-connection element; and the output of the second cross-connection element being connected to an input of the first adder of the linear time encoder.

2. The circuit of claim 1, wherein the linear time encoder further includes a first integrator, a second adder, a second integrator, a quantizer having an output, wherein an output of the first adder is connected to an input of the first integrator, an output of the first integrator is connected to a first input of the second adder, an output of the second adder is connected to an input of the second integrator, an output of the second integrator is connected to an input of the quantizer, the output of one of the quantizer is connected to the output of the linear time encoder and a one bit DAC is connected between the output of the quantizer and a second input of the second adder.

3. The circuit of claim 1, wherein the circuit includes a plurality of said linear time encoders, a plurality of said first cross-connection elements, a plurality of said second cross-connection elements, and a plurality of said non-linear time encoders.

4. The circuit of claim 1, wherein the input of the linear time encoder is connected to a pulse time encoded signal.

5. The circuit of claim 4, wherein the pulse time encoded signal is generated from an analog signal processed by a time encoder.

6. The circuit of claim 1, wherein the output of the non-linear time encoder is connected to an input of a lowpass filter, an output of the lowpass filter outputting an analog output.

7. The circuit of claim 1, wherein the non-linear time encoder further includes the first adder having a second input and an output, a second adder having a first input, a second input, a third input, and an output, a first integrator having an input and an output, a non-linear element having an input and an output, a third adder having a first input, a second input, and an output, a second integrator having an input and an output, one of a quantizer and a hysteresis quantizer, each having an input and an output, a first self-feedback element having an input and an output, a second self-feedback element having an input and an output, and a bias element having an output, being connected as:

the output of the first adder being connected to a first input of the second adder, the output of the second adder being connected to the input of the first integrator, the output of the first integrator being connected to the input of the non-linear element, the output of the non-linear element being connected to the first input of the third adder, the output of the third adder being connected to the input of the second integrator, the output of the second integrator being connected to the input of one of the quantizer and the hysteresis quantizer, the output of the one of the quantizer and the hysteresis quantizer being connected to the output of the non-linear time encoder, the output of the bias element being connected to the second input of the second adder, the output of the first integrator being connected to the input of the first self-feedback element, the output of the first self-feedback element being connected to the third input of the second adder, the output of the one of the quantizer and the hysteresis quantizer being connected to the input of the second self-feedback element, and the output of the second self-feedback element being connected to the second input of the first adder.

8. The circuit of claim 7 further including an amplifier having an input and an output, the input of the amplifier being connected to the output of the one of the quantizer and the hysteresis quantizer and the output of the amplifier being connected to the second input of the third adder.

9. The circuit of claim 1, wherein the first cross-connection element includes a two dimensional array of 1-bit digital to analog converters.

10. The circuit of claim 1, wherein the second cross-connection element includes a two dimensional array of 1-bit digital to analog converters.

11. A method of making a circuit for linear programming in a pulse domain, the method comprising:

providing a linear time encoder having an input, the input including a first adder, and an output;

providing at least a first cross-connection element and a second cross-connection element, each having an input and an output;

connecting the output of the linear time encoder to the input of the first cross-connection element;

providing a non-linear time encoder having an input, the input including a first adder, and an output;

connecting the output of the first cross-connection element to a first input of the first adder of the non-linear time encoder;

connecting the output of the non-linear time encoder to the input of the second cross-connection element; and connecting the output of the second cross-connection element to an input of the first adder of the linear time encoder.

12. The method of claim 11, wherein the providing the linear time encoder further includes:

providing a first integrator, providing a second adder, providing a second integrator, providing one of a quantizer having an output, connecting an output of the first adder to an input of the first integrator, an output of the first integrator to a first input of the second adder, connecting an output of the second adder is connected to an input of the second integrator, connecting an output of the second integrator to an input of the quantizer, and connecting an output of the quantizer to the output of the linear time encode.

13. The method of claim 12, wherein the connecting the output of one of the quantizer and the hysteresis quantizer further includes connecting a one bit DAC between one of an output of the quantizer and an output of the hysteresis quantizer and a second input of the second adder.

14. The method of claim 11, wherein the method further includes providing a plurality of the linear time encoders, providing a plurality of the first cross-connection elements, providing a plurality of the second cross-connection elements, and providing a plurality of the non-linear time encoders.

15. The method of claim 11, wherein the providing the linear time encoder further includes connecting the input of the linear time encoder to a pulse time encoded signal.

16. The method of claim 15, wherein the connecting the input of the linear time encoder further includes generating the pulse time encoded signal from an analog signal processed by a time encoder.

17. The method of claim 11, wherein the providing the non-linear time encoder further includes connecting the output of the non-linear time encoder to an input of a lowpass filter, an output of the lowpass filter outputting an analog output.

18. The method of claim 11, wherein the providing the non-linear time encoder further includes:

providing the first adder to have a second input and an output, providing a second adder to have a first input, a second input, a third input, and an output, providing a first integrator to have an input and an output, providing a non-linear element to have an input and an output, providing a third adder to have a first input, a second input, and an output, providing a second integrator to have an input and an output, providing one of a quantizer and a hysteresis quantizer, each to have an input and an output, providing a first self-feedback element to have an input and an output, providing a second self-feedback element to have an input and an output, and providing a bias element to have an output, and connecting the output of the first adder to a first input of the second adder, the output of the second adder being connected to the input of the first integrator, connecting the output of the first integrator to the input of the non-linear element, connecting the output of the non-linear element to the first input of the third adder, connecting the output of the third adder to the input of the second integrator, connecting the output of the second integrator to the input of one of the quantizer and the hysteresis quantizer, connecting the output of the one of the quantizer and the hysteresis quantizer to the output of the non-linear time encoder, connecting the output of the bias element to the second input of the second adder, connecting the output of the first integrator to the input of the first self-feedback element, connecting the output of the first self-feedback element to the third input of the second adder, connecting the output of the one of the quantizer and the hysteresis quantizer to the input of the second self-feedback element, and connecting the output of the second self-feedback element to the second input of the first adder.

19. The method of claim 18, wherein the connecting the output of the one of the quantizer and the hysteresis quantizer further includes providing an amplifier having an input and an output, connecting the input of the amplifier to the output of the one of the quantizer and the hysteresis quantizer and connecting the output of the amplifier to the second input of the third adder.

20. The method of claim 11, wherein the providing the first cross-connection element further includes providing a plurality of digital-to-analog converters having at least one bit.

21. The method of claim 11, wherein the providing the second cross-connection element further includes providing a plurality of digital-to-analog converters having at least one bit.

22. A computer-readable medium having computer-executable instructions for:

providing a linear time encoder having an input, the input including a first adder, and an output;

providing at least a first cross-connection element and a second cross-connection element, each having an input and an output;

connecting the output of the linear time encoder to the input of the first cross-connection element;

providing a non-linear time encoder having an input, the input including a first adder, and an output;

connecting the output of the first cross-connection element to a first input of the first adder of the non-linear time encoder;

connecting the output of the non-linear time encoder to the input of the second cross-connection element; and connecting the output of the second cross-connection element to an input of the first adder of the linear time encoder.

* * * * *